(12) United States Patent
Kang et al.

(10) Patent No.: US 10,312,397 B2
(45) Date of Patent: *Jun. 4, 2019

(54) AVALANCHE PHOTODIODE WITH LOW BREAKDOWN VOLTAGE

(71) Applicant: Intel Corporation, Santa Clara, CA (US)

(72) Inventors: Yimin Kang, San Jose, CA (US); Han-Din Liu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/442,512

(22) Filed: Feb. 24, 2017

(65) Prior Publication Data

US 2017/0256671 A1   Sep. 7, 2017

Related U.S. Application Data

(63) Continuation of application No. 13/976,379, filed as application No. PCT/US2011/067934 on Dec. 29, 2011, now Pat. No. 9,614,119.

(51) Int. Cl.
*H01L 31/107* (2006.01)
*G02B 6/42* (2006.01)
*H01L 31/02* (2006.01)

(52) U.S. Cl.
CPC ............ *H01L 31/1075* (2013.01); *G02B 6/42* (2013.01); *H01L 31/02027* (2013.01)

(58) Field of Classification Search
CPC ......... H01L 29/66113; H01L 31/02027; H01L 31/107; H01L 31/1075
See application file for complete search history.

(56) References Cited

U.S. PATENT DOCUMENTS 4,083,062 A   4/1978   Ohuchi et al.
6,359,322 B1  3/2002   Haralson et al.
(Continued)

FOREIGN PATENT DOCUMENTS

JP    2001127336 A    5/2001
TW    201240125 A    10/2012
WO    2011083657 A1   7/2011

OTHER PUBLICATIONS

"Monolithic germanium/silicon avalanche photodiodes with 340 GHz gain-bandwidth product" by Yimin Kang et al. in Nature Photonics-Letters, published online Dec. 7, 2008.
(Continued)

*Primary Examiner* — Eric A. Ward
(74) *Attorney, Agent, or Firm* — Schwabe, Williamson & Wyatt, P.C.

(57) ABSTRACT

An Si/Ge SACM avalanche photodiodes (APD) having low breakdown voltage characteristics includes an absorption region and a multiplication region having various layers of particular thicknesses and doping concentrations. An optical waveguide can guide infrared and/or optical signals or energy into the absorption region. The resulting photogenerated carriers are swept into the i-Si layer and/or multiplication region for avalanche multiplication. The APD has a breakdown bias voltage of well less than 12 V and an operating bandwidth of greater than 10 GHz, and is therefore suitable for use in consumer electronic devices, high speed communication networks, and the like.

19 Claims, 5 Drawing Sheets

(56) References Cited

U.S. PATENT DOCUMENTS

| | | | |
|---|---|---|---|
| 6,858,829 | B2 | 2/2005 | Nishimura et al. |
| 7,082,248 | B1 | 7/2006 | Morse |
| 7,340,709 | B1 | 3/2008 | Masini et al. |
| 7,397,101 | B1 * | 7/2008 | Masini .................. H01L 31/028 257/184 |
| 7,741,657 | B2 | 6/2010 | Pauchard et al. |
| 2004/0033654 | A1 | 2/2004 | Yamagata |
| 2006/0289957 | A1 | 12/2006 | Morse et al. |
| 2008/0017883 | A1 * | 1/2008 | Sarid .................. H01L 31/1075 257/186 |
| 2008/0231738 | A1 * | 9/2008 | Iida .................. H01L 27/14603 348/308 |
| 2009/0026494 | A1 | 1/2009 | Itzler |
| 2012/0126286 | A1 * | 5/2012 | Na .................. H01L 31/105 257/186 |
| 2012/0199932 | A1 | 8/2012 | Bowers |
| 2012/0326259 | A1 | 12/2012 | Huang et al. |
| 2014/0217264 | A1 | 8/2014 | Shepard et al. |

OTHER PUBLICATIONS

International Search Report and Written Opinion, dated Sep. 14, 2012, 10 pages, International Application No. PCT/US2011/067934, Korean Intellectual Property Office, Metropolitan City, Korea.

Bowers et al., "High-gain high-sensitivity resonant Ge/Si APD photodetectors," Proc. of SPIE vol. 7660, May 2010, pp. 76603H-I-7603H-8.

Ruegg, "An Optimized Avalanche Photodiode," IEEE Transaction on Electron Devices, vol. 14, No. 5, May 1967, pp. 239-251.

Office Action dated Oct. 23, 2014 for Taiwan Patent Application No. 101143994, 14 pages.

Office Action dated Jan. 30, 2015 for Taiwan Patent Application No. 101143994, 8 pages.

Office Action dated Oct. 27, 2015 for Chinese Patent Application No. 201180076057.4, 24 pages.

Office Action dated Jul. 6, 2016 for Chinese Patent Application No. 201180076057.4, 15 pages.

Office Action dated Jan. 19, 2017 for Chinese Patent Application No. 201180076057.4, 14 pages.

Supplementary European Search Report dated Sep. 16, 2015 for European Patent Application No. 11879014.6 7 pages.

Cheng et al., "Silicon-based long wavelength photodetectors," SPIE-OSA-IEEE, (2009), vol. 7631, 9 pages.

Office Action dated Aug. 2, 2016 for Korean Patent Application No. 10-2014-7017849, 7 pages.

Non-Final Office Action dated Jan. 15, 2015 for U.S. Appl. No. 13/976,379, 31 pages.

Final Office Action dated Jul. 15, 2015 for U.S. Appl. No. 13/976,379, 34 pages.

Notice of Allowance dated Nov. 18, 2016 for U.S. Appl. No. 13/976,379, 8 pages.

Office Action and Search Report dated Dec. 13, 2017 for Taiwan Patent Application No. 101143994, 19 pages.

Yimin Kang et al., "Monolithic Ge/Si avalanche photodiodes",Group IV Photonics, 2009, 6th IEEE International Conference, Sep. 9-11, 2009, 3 pages.

Jurgen Michel et al., "High-performance Ge-on-Si photodetectors", Nature Photonics, vol. 4, Aug. 2010, pp. 527-534.

Office Action dated Jul. 16, 2018 for Taiwan Patent Application No. 106139025, 15 pages.

* cited by examiner

AVALANCHE PHOTODIODE WITH LOW BREAKDOWN VOLTAGE

CROSS-REFERENCE TO RELATED APPLICATIONS

This application is a continuation of U.S. patent application Ser. No. 13/976,379, filed Jun. 26, 2013, entitled "AVALANCHE PHOTODIODE WITH LOW BREAKDOWN VOLTAGE," which is the U.S. national stage of International Application No. PCT/US2011/067934, filed Dec. 29, 2011, entitled "AVALANCHE PHOTODIODE WITH LOW BREAKDOWN VOLTAGE," the disclosures of both of which are incorporated herein by reference in their entirety for all purposes.

GOVERNMENT FUNDING

This invention was made with government support under contract No. HR0011-06-3-0009 awarded by DARPA. The government has certain rights in the invention.

TECHNICAL FIELD

Embodiments generally relate to photodiodes, and more particularly, to Silicon/Germanium (Si/Ge) separate absorption, charge and multiplication (SACM) avalanche photodiodes (APDs) having low breakdown voltage characteristics.

BACKGROUND

Avalanche Photodiodes (APD) are mainly used in applications where high sensitivity is desired. Such applications include long haul fiber-optic telecommunication, laser rangefinder, and single photon level detection and imaging, among other applications. SiGe APD offers promising applications targeted at near-infrared optical signals. In a Si/Ge separate absorption, charge and multiplication (SACM) APD, Germanium (Ge) offers high responsivity at near-infrared wavelengths, while Silicon (Si) is used to amplify the generated photocarriers with low noise.

In addition, the applicability of CMOS technology to the fabrication of SiGe based APDs promises reduced prices compared to its III-V APD counterparts. Since APDs have traditionally targeted high-end markets mainly due to higher cost constraints, SiGe APD is a promising candidate for low end markets that require high sensitivity in the near infrared spectrum.

However, reduced price alone is insufficient to realize the widespread application of APDs. The biggest obstacle is the high bias required for the operation of APDs, which in the conventional art operate far beyond the maximum available bias of 12 V found within modern electronics such as server, desktop, and other consumer electronics.

Accordingly, it would be desirable to reduce the operating bias, or breakdown bias, of Si/Ge APDs so that they can be successfully incorporated into consumer electronics, high speed communication networks, and the like.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Reference will now be made in detail to embodiments of the invention, examples of which are illustrated in the accompanying drawings. In the following detailed description, numerous specific details are set forth to enable a thorough understanding of the present invention. It should be understood, however, that persons having ordinary skill in the art may practice the present invention without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
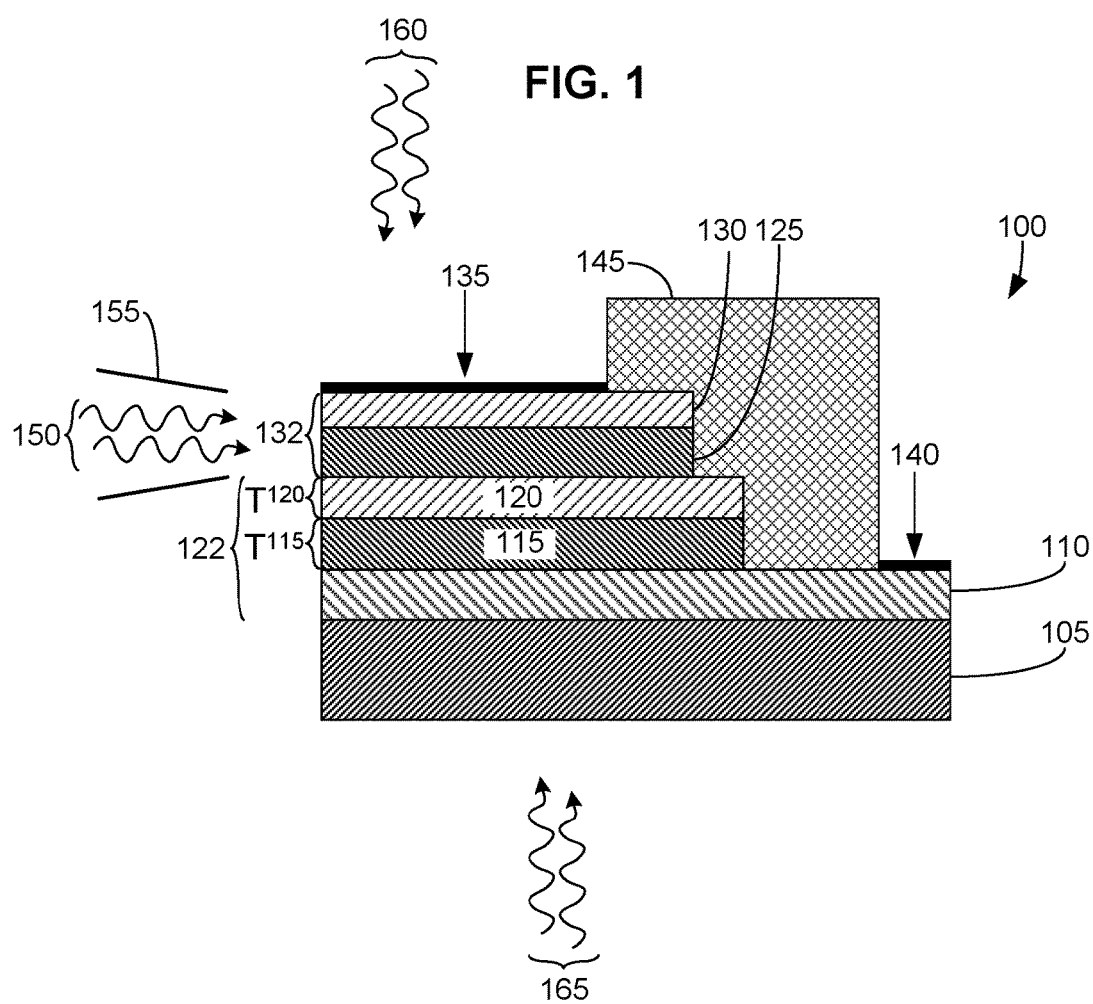
FIG. 1 illustrates a cross-sectional view of an avalanche photodiode (APD) in accordance with embodiments of the present invention.

FIG. 1 illustrates a cross-sectional view of an avalanche photodiode (APD) 100 in accordance with embodiments of the present invention. The APD 100 can be a Si/Ge separate absorption, charge and multiplication (SACM) low voltage avalanche photodiode (LVAPD). For the sake of consistency but not limitation, the avalanche photodiode discussed herein will be referred to simply as the APD 100. It will be understood that the various layers and components of the APD 100 as illustrated are not necessarily drawn to scale, but rather, they are illustrated in such a manner as to clearly show each of the components.

The APD 100 can include a substrate 105. An n-type doped silicon ($n^+$ Si) layer 110 can be disposed on the substrate 105. An intrinsic silicon (i-Si) layer 115 can be disposed on at least a portion of the $n^+$ Si layer 110. Atop the i-Si layer 115, a p-type doped silicon (p Si) layer 120 can be disposed. The $n^+$ Si layer 110, the i-Si layer 115, and the p Si layer 120 can form a carrier multiplication region 122.

In some embodiments, the thickness $T^{120}$ of the p Si layer 120 is 20 nanometers (nm). In some embodiments, the thickness $T^{120}$ of the p Si layer 120 is about 20 nm, or in other words, approximately 20 nm. In some embodiments, the doping concentration of the p Si layer 120 is between $2\times10^{18}$ cm$^{-3}$ to $3\times10^{18}$ cm$^{-3}$. In some embodiments, the doping concentration of the p Si layer 120 is between about $2\times10^{18}$ cm$^{-3}$ to $3\times10^{18}$ cm$^{-3}$, or in other words, between approximately $2\times10^{18}$ cm$^{-3}$ to $3\times10^{18}$ cm$^3$.

In some embodiments, the thickness $T^{115}$ of the i-Si layer 115 is between 0.07 to 0.13 micrometers (μm). In some embodiments, the thickness $T^{115}$ of the i-Si layer 115 is between about 0.07 to 0.13 μm, or in other words, between approximately 0.07 to 0.13 μm. In some embodiments, the thickness $T^{115}$ of the i-Si layer 115 is 100 nm. In some embodiments, the thickness $T^{115}$ of the i-Si layer 115 is about 100 nm, or in other words, approximately 100 nm. In some embodiments, the doping concentration of the i-Si layer 115 is less than $5\times10^{15}$ cm$^{-3}$. In some embodiments, the doping concentration of the i-Si layer 115 is less than about $5\times10^{15}$ cm$^{-3}$, or in other words, less than approximately $5\times10^{15}$ cm$^{-3}$.

An intrinsic germanium (i-Ge) layer 125 can be disposed on at least a portion of the p Si layer 120. A p-type doped silicon (p$^+$ Ge) layer 130 can be disposed on the i-Ge layer 125. The p$^+$ Ge layer 130 and the i-Ge layer 125 can form an absorption region 132. A passivation layer 145 can be disposed on at least a portion of each of the p$^+$ Ge layer 130, the p Si layer 120, and the n$^+$ Si layer 110. A first metal contact 135 can be disposed on the p$^+$ Ge layer 130 and a second metal contact 140 can be disposed on the n$^+$ Si layer 110.

An optical waveguide 155 can guide infrared, near-infrared, and/or optical signals or energy 150 into the absorption region 132. For example, an evanescent or a hybrid of a butt and evanescent coupling of optical signals through the waveguide 155 into the absorption region 132 can be used, particularly for high speed operations. In some embodiments, the incoming infrared and/or optical signals or energy is first collected in the i-Ge layer 125 and/or absorption region 132, and the resulting photo-generated carriers are swept into the i-Si layer 115 and/or multiplication region 122 for avalanche multiplication. Alternatively, or in addition to, the infrared and/or optical signals or energy can be introduced to the APD 100 from the top 160 or from the bottom 165 relative to the layers of the APD 100.

The different doped layers control the APD's internal electric field such that the APD 100 functions correctly. In addition to the approximately 100 nm thick i-Si layer 115, the p Si charge layer 120 can be highly doped and made exceptionally thin, as set forth in detail above, to suppress the APD operating bias below 12 V. The thickness of each of the p$^+$ Ge layer 130, the i-Ge layer 125, the n$^+$ Si layer 110, and the substrate 105 are not as critical, nor do they require a particular specific layer thickness to be operable with the inventive aspects disclosed herein. The thickness and doping concentrations of each of the p Si layer 120 and the i-Si layer 115, are of more importance to achieve the low bias voltage and high performance as described herein.

The APD 100 has associated therewith a breakdown bias voltage. Preferably, the breakdown bias is 8.5 V or thereabout. In some embodiments, the breakdown bias is less than 12 V, or thereabout. The APD 100 also has associated therewith an operating bandwidth. Preferably, the operating bandwidth is 10 GHz, or thereabout. In some embodiments, the operating bandwidth is greater than 8 GHz. In some embodiments, the operating bandwidth is greater than 10 GHz. The simulation, measurement, and performance characteristics of the APD 100 are discussed in further detail below.

Figure 2:
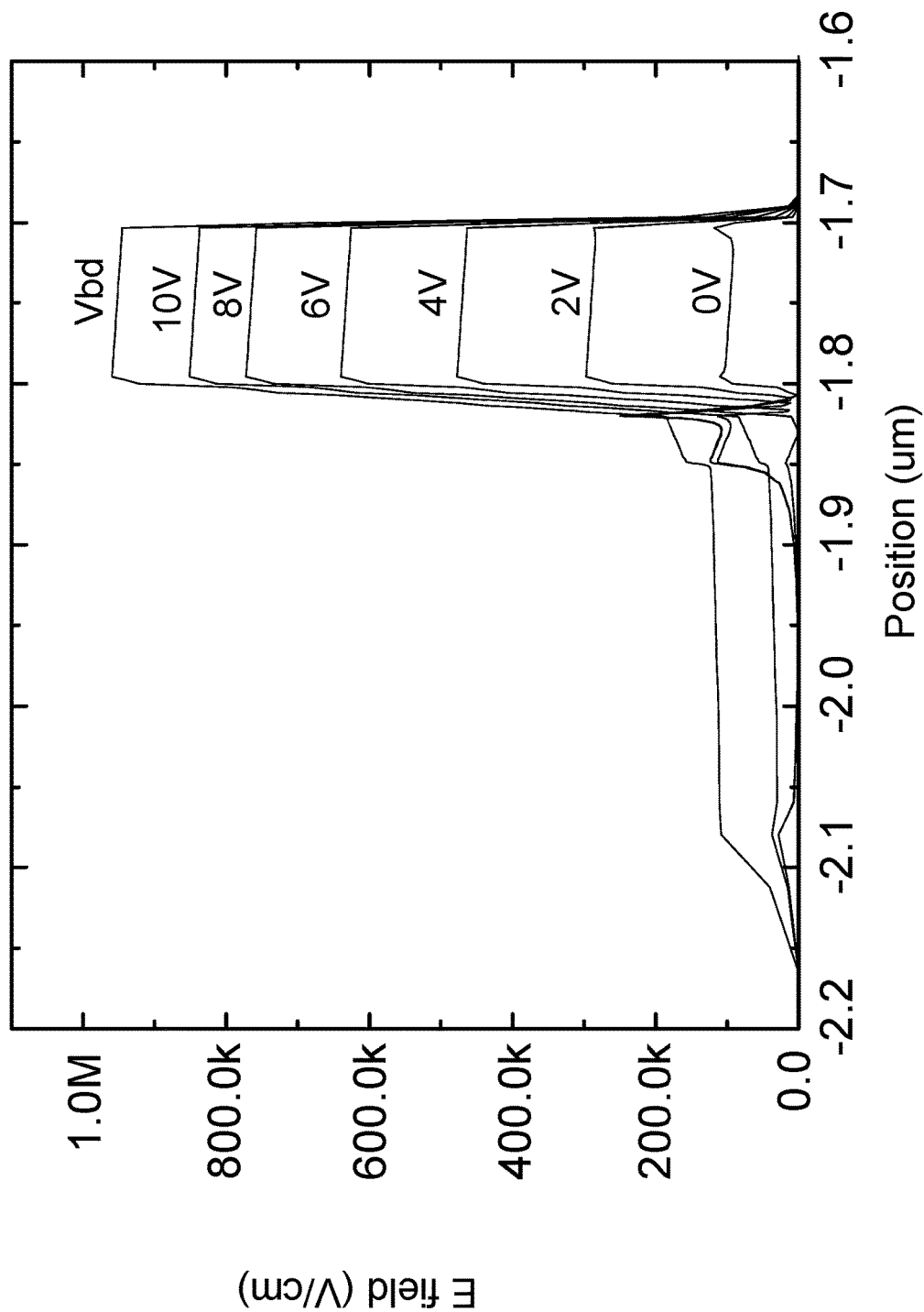
FIG. 2 illustrates a plot of ideal internal electric field distribution of the APD of FIG. 1.

FIG. 2 illustrates a plot of ideal internal electric field distribution of the APD of FIG. 1. Performance aspects such as bandwidth and sensitivity of an APD are dependent on its internal electric field profile or distribution. The electric field within the Ge absorption region 132 ensures that the photo-generated carriers quickly drift out to achieve high bandwidth, but kept sufficiently low to avoid either avalanche multiplication or tanneling within the Ge material. In addition, the high electric field confined within the Si multiplication region 122 provides the avalanche gain to attain high sensitivities. The electric field profile is sensitive and dependent on the doping levels of each layer. For example, the electric field profile is sensitive and dependent on the doping concentration of the p Si layer 120 and the i-Si layer 115, as set forth above.

Figure 3:
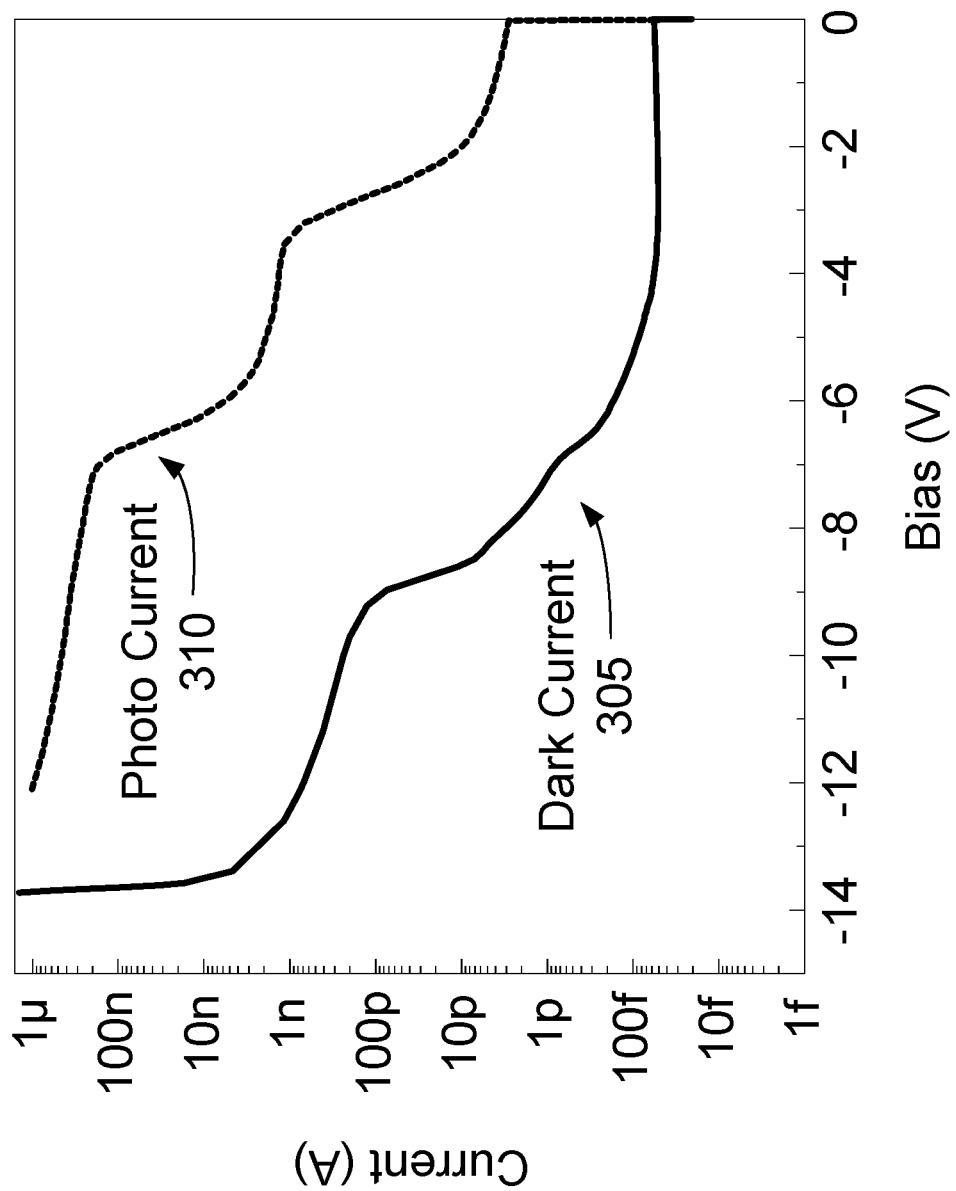
FIG. 3 illustrates a plot of simulated dark current and photocurrent of the APD of FIG. 1.
Figure 4:
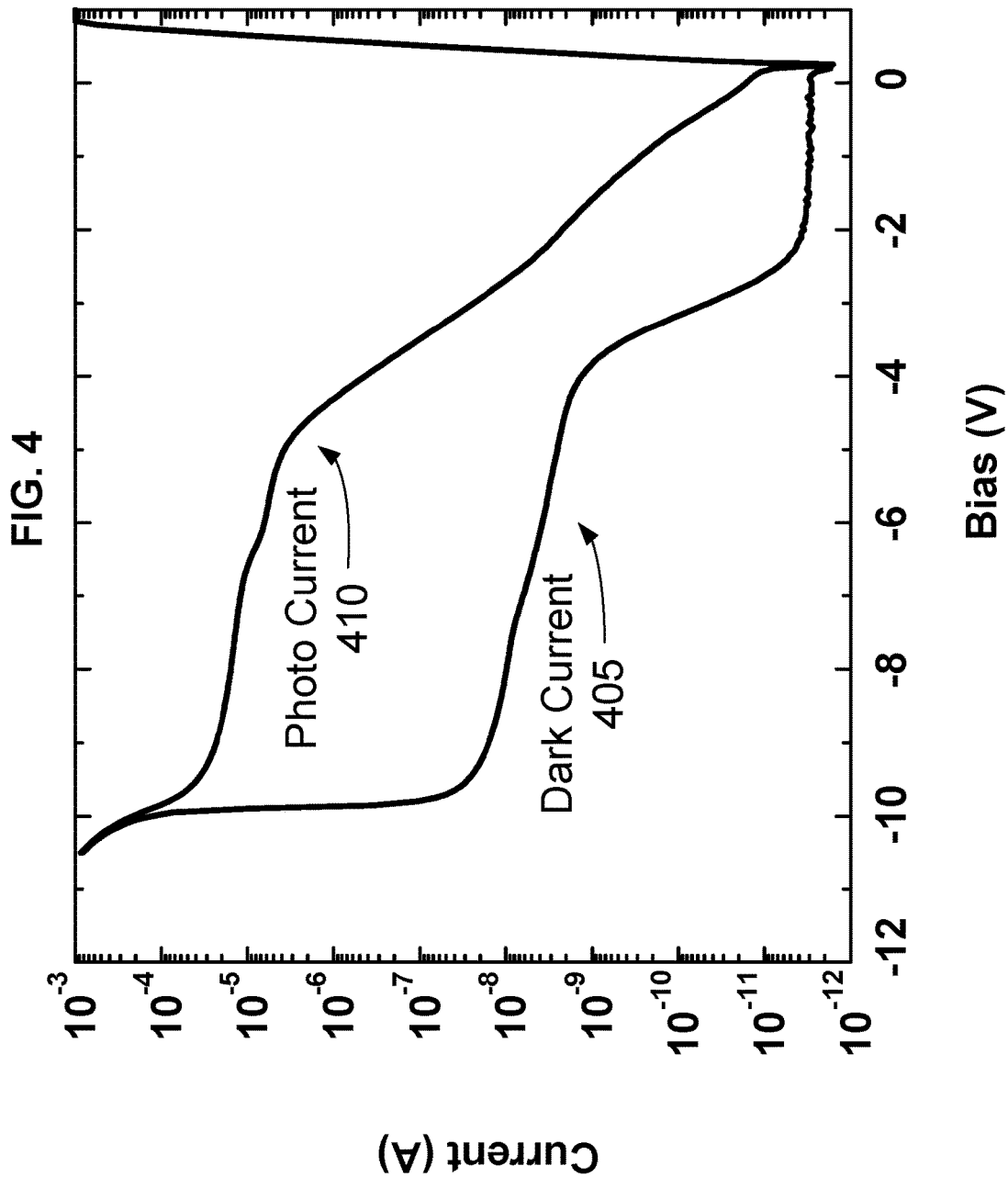
FIG. 4 illustrates a plot of measured dark current and photocurrent of the APD of FIG. 1.

FIG. 3 illustrates a plot of simulated dark current and photocurrent of the APD of FIG. 1. FIG. 4 illustrates a plot of measured dark current and photocurrent of the APD of FIG. 1. Reference is now made to FIGS. 3 and 4.

The dark current (e.g., 305 of FIG. 3 and 405 of FIG. 4) and the photocurrent (e.g., 310 of FIG. 3 and 410 of FIG. 4) is shown in each of the respective plots. The photocurrent corresponds to the APD current under illumination. The results of the simulation can be evaluated and used to determine the preferred or otherwise optimal layer thicknesses and doping concentrations. The measured values confirm the operating characteristics and performance of the APD 100.

Figure 5:
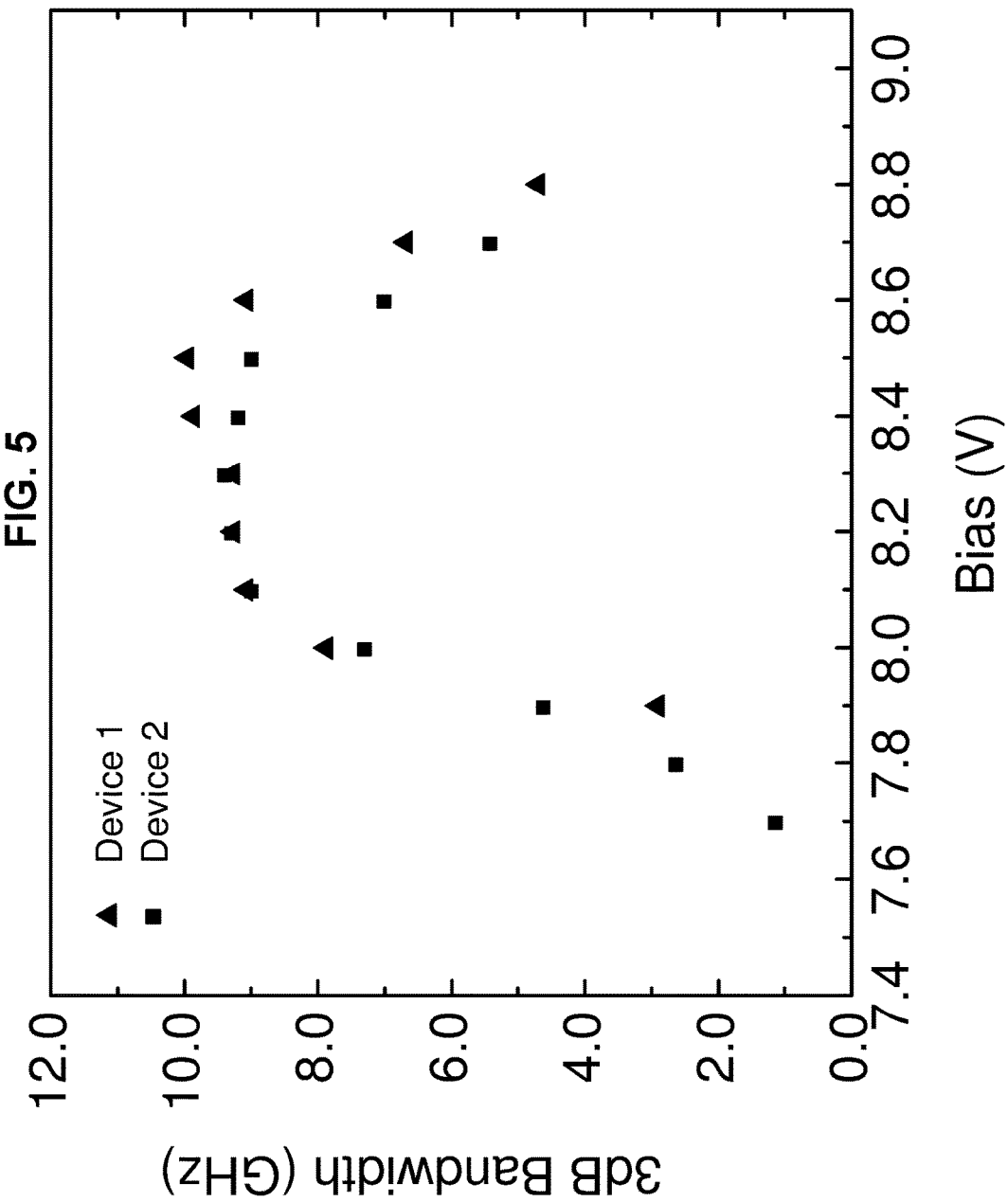
FIG. 5 illustrates a plot of measured bandwidth of two sample APDs in accordance with embodiments of the present invention.

FIG. 5 illustrates a plot of measured bandwidth of two sample APDs in accordance with embodiments of the present invention. The measured breakdown bias, or in other words the operating bias, is about 8.5 V, which is well below the targeted 12 V of consumer electronics. The photo-response of the APD 100, which is illuminated under 1550 nm laser, can be observed in FIG. 5. The bandwidth measurements show that the APD 100 is capable of operating at bandwidths over 10 GHz, while operating at voltages below 12 V. Embodiments of the APD disclosed herein can be incorporated into applications such as long haul fiber-optic telecommunication, laser rangefinder, and single photon level detection and imaging, among other applications. Moreover, SiGe APD offers promising applications targeted at near-infrared optical signals.

The inventive aspects of the APD 100, as disclosed herein, enables Si/Ge APD technology to be available within consumer electronics, which is a market in which APDs have traditionally had difficulty entering due to operating voltage and cost constraints. The embodiments of the invention disclosed herein can be used in various high speed and high sensitivity optical receiver silicon photonics systems that require low voltage operation.

Although particular embodiments have been described, it will be appreciated that the principles of the invention are not limited to those embodiments. The inventive concepts described herein can be used in high-speed communications systems, for example, including 10 Gbit/s or higher communication networks. The avalanche photodiodes described herein can be included within general purpose computers, tablets, smart phones, ultrabooks, servers, or the like. Embodiments disclosed herein provide compact, high performance, and high frequency response APDs having low breakdown bias characteristics.

Other variations and modifications may be made without departing from the principles of the invention as set forth in the following claims.

What is claimed is:

1. A semiconductor avalanche photodiode (APD), comprising:
   a first region of n-type doped silicon;
   a second region disposed directly above the first region, the second region being of silicon, and wherein a thickness of the second region is between about 0.07 micrometers and about 0.13 micrometers;
   a third region disposed directly above the second region, the third region being of p-type doped silicon; and
   a fourth region disposed directly above the third region, separated from the second region by the third region, and further separated from the first region by the second region and the third region, the fourth region being of germanium, wherein a surface of the fourth region completely overlaps with a portion of a surface of the third region, and a remaining portion of the surface of the third region is free from the surface of the fourth region.

2. The APD of claim 1, further comprising:
   a substrate, wherein the first region, the second region, the third region, and the fourth region are formed on the substrate.

3. The APD of claim 1, further comprising:
   a fifth region disposed on the fourth region, wherein the fifth region includes p-type doped material.

4. The APD of claim 3, further comprising:
   a metal contact disposed on the fifth region.

5. The APD of claim 1, wherein the thickness of the second region is about 100 nanometers.

6. The APD of claim 1, wherein the second region has a doping concentration of less than about $5 \times 10^{15}$ centimeters$^{-3}$ (cm$^{-3}$).

7. The APD of claim 1, wherein the third region has a doping concentration of between about $2 \times 10^{18}$ centimeters$^{-3}$ (cm$^{-3}$) and about $3 \times 10^{18}$ cm$^{-3}$.

8. The APD of claim 1, wherein the second region is doped differently than the first region and the third region.

9. The APD of claim 1, wherein the APD is a group-IV APD.

10. The APD of claim 1, wherein a thickness of the third region is about 20 nanometers, wherein the thickness of the third region is measured from a first surface of the third region adjacent to a surface of the fourth region to a second surface of the third region adjacent to a surface of the second region.

11. A semiconductor avalanche photodiode (APD), comprising:
    a first region of n-type doped silicon above a substrate;
    a second region disposed directly above the first region and further above the substrate, the second region being of silicon, and wherein the second region has a doping concentration of less than about $5 \times 10^{15}$ centimeter$^{-3}$ (cm$^{-3}$);
    a third region disposed directly above the second region and further above the substrate, the third region being of p-type doped silicon, and wherein the third region has a doping concentration of between about $2 \times 10^{18}$ cm$^{-3}$ and about $3 \times 10^{18}$ cm$^{-3}$; and
    a fourth region disposed directly above the third region and further above the substrate, separated from the second region by the third region, and further separated from the first region by the second region and the third region, the fourth region being of germanium.

12. The APD of claim 11, wherein the second region has a thickness of between about 0.07 micrometers and about 0.13 micrometers.

13. The APD of claim 12, wherein the thickness of the second region is about 100 nanometers.

14. The APD of claim 11, further comprising:
    a substrate, wherein the first region, the second region, the third region, and the fourth region are formed on the substrate.

15. The APD of claim 11, wherein the third region has a thickness of about 20 nanometers, wherein the thickness of the third region is measured from a first surface of the third region adjacent to a surface of the fourth region to a second surface of the third region adjacent to a surface of the second region.

16. The APD of claim 11, further comprising:
    a fifth region disposed on the fourth region, wherein the fifth region includes p-type doped material.

17. The APD of claim 16, further comprising:
    a metal contact disposed on the fifth region.

18. The APD of claim 17, wherein the metal contact is a first metal contact, and wherein the APD further comprises:
    a second metal contact disposed on the first region.

19. The APD of claim 11, wherein the second region is doped differently than the first region and the third region.

* * * * *